United States Patent
Lu

(10) Patent No.: US 11,287,909 B2
(45) Date of Patent: Mar. 29, 2022

(54) SENSITIVITY-ADJUSTABLE MOUSE

(71) Applicant: Primax Electronics Ltd., Taipei (TW)

(72) Inventor: Chun-Cheng Lu, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 50 days.

(21) Appl. No.: 16/885,590

(22) Filed: May 28, 2020

(65) Prior Publication Data

US 2021/0325976 A1    Oct. 21, 2021

(30) Foreign Application Priority Data

Apr. 15, 2020   (CN) .......................... 202010293553.6

(51) Int. Cl.
  *G06F 3/038*      (2013.01)
  *H05K 7/14*       (2006.01)
  *H05K 5/03*       (2006.01)
  *H05K 1/18*       (2006.01)
  *F21V 8/00*       (2006.01)
  *F21V 23/04*      (2006.01)
  *G06F 3/0354*     (2013.01)
  *F21V 19/00*      (2006.01)
  *F21Y 115/10*     (2016.01)

(52) U.S. Cl.
  CPC .......... *G06F 3/038* (2013.01); *F21V 19/0015* (2013.01); *F21V 23/04* (2013.01); *G02B 6/0001* (2013.01); *G06F 3/03543* (2013.01); *H05K 1/181* (2013.01); *H05K 5/03* (2013.01); *H05K 7/1427* (2013.01); *F21Y 2115/10* (2016.08); *H05K 2201/10106* (2013.01); *H05K 2201/10121* (2013.01)

(58) Field of Classification Search
CPC .. G06F 3/038; G06F 3/03543; F21V 19/0015; F21V 23/04
See application file for complete search history.

(56) References Cited

U.S. PATENT DOCUMENTS

| | | | | |
|---|---|---|---|---|
| 5,403,984 A * | 4/1995 | Ogawa | ................. | H01H 13/705 200/313 |
| 5,584,381 A * | 12/1996 | Brundage | ............ | H01H 23/025 200/313 |
| 5,865,302 A * | 2/1999 | Suzuki | ................... | H01H 9/182 200/315 |
| 7,067,752 B2 * | 6/2006 | Shin | ..................... | H01H 23/025 200/310 |

(Continued)

Primary Examiner — Bryon T Gyllstrom
Assistant Examiner — Christopher E Dunay
(74) Attorney, Agent, or Firm — Kirton McConkie; Evan R. Witt

(57) ABSTRACT

A sensitivity-adjustable mouse includes a casing, a switching button, an illumination module and a lightshade cover. The switching button is installed on the casing and swingable relative to the casing. The illumination module is disposed within the casing and located under the switching button. The illumination module emits plural light beams to the switching button. The lightshade cover is connected with the switching button and arranged between the switching button and the illumination module. The plural light beams are divided by the lightshade cover. The illumination module and the lightshade cover are covered by the switching button. Due to the appearance of a single button structure, the appearance of the mouse is aesthetically pleasing.

8 Claims, 6 Drawing Sheets

(56) References Cited

U.S. PATENT DOCUMENTS

| | | | | |
|---|---|---|---|---|
| 7,193,170 B2* | 3/2007 | Katayama | ............ | H01H 13/023 200/310 |
| 8,193,463 B2* | 6/2012 | Mae | .................... | H01H 25/041 200/313 |
| 8,247,722 B2* | 8/2012 | Ominato | ................ | D05B 69/04 200/314 |
| 2005/0012717 A1* | 1/2005 | Park | .................... | G06F 3/03543 345/163 |
| 2005/0073499 A1* | 4/2005 | Wang | ................. | G06F 3/03543 345/163 |
| 2006/0262091 A1* | 11/2006 | Wang | ....................... | G06F 3/038 345/163 |
| 2007/0057918 A1* | 3/2007 | Zhou | .................... | G06F 3/0383 345/163 |
| 2008/0007525 A1* | 1/2008 | Sim | .................... | G06F 3/03543 345/163 |
| 2009/0046062 A1* | 2/2009 | Sayyadi | .............. | G06F 3/03543 345/158 |
| 2011/0141023 A1* | 6/2011 | Junior | ................. | G06F 3/03543 345/166 |
| 2013/0120262 A1* | 5/2013 | Piot | ......................... | G06F 3/048 345/163 |
| 2017/0220132 A1* | 8/2017 | O'Mahony | ............. | G06F 3/038 |
| 2018/0113518 A1* | 4/2018 | Chen | .................. | G06F 3/03543 |
| 2019/0220107 A1* | 7/2019 | Odgers | ................ | G06F 3/0304 |
| 2020/0209981 A1* | 7/2020 | Unnikrishnan | ......... | G06F 3/023 |
| 2020/0209988 A1* | 7/2020 | Lu | .......................... | G06F 3/038 |

* cited by examiner

SENSITIVITY-ADJUSTABLE MOUSE

FIELD OF THE INVENTION

The present invention relates to an input device, and more particularly to a mouse capable of controlling the movement of a cursor.

BACKGROUND OF THE INVENTION

A mouse is one of the widely-used computer peripheral input devices. When a mouse is held by the palm of a user, the user may move the mouse to control the movement of a cursor of the computer system. The mouse complies with the intuitive operating habits of many users. Consequently, the mouse is the most prevailing input device.

Hereinafter, the structure and the function of a conventional mouse will be illustrated with reference to FIG. 1. FIG. 1 schematically illustrates the connection between a conventional sensitivity-adjustable mouse and a computer system. The computer system 100 comprises a computer host 101 and a display screen 102. The computer host 101 is in communication with a mouse 1 and the display screen 102. The computer host 101 has a connecting port 1011. A graphic-based window 1021 and a cursor 1022 are shown on the display screen 102. The mouse 1 is used for controlling the cursor 1022 to have the computer host 101 execute a corresponding command. The mouse 1 comprises a casing 10, a left button 11, a right button 12, a scroll wheel 13, and a connecting cable 14. The left button 11 is installed on the casing 10 and located beside a left side of the scroll wheel 13. In addition, the left button 11 is exposed outside the casing 10. When the left button 11 is pressed down, a left button signal is generated. Like the left button 11, the right button 12 is installed on the casing 10 and located beside a right side of the scroll wheel 13. When the right button 12 is pressed down, a right button signal is generated. The scroll wheel 13 is disposed within the casing 10 and partially exposed outside the casing 10. When the scroll wheel 13 is rotated, a corresponding scrolling data is generated. After the scrolling data is transmitted to the computer host 101, the computer host 101 scrolls the graphic-based window 1021 upwardly or downwardly according to the scrolling data. The connecting cable 14 is connected with the casing 10 and protruded outside the casing 10. When the connecting cable 14 is connected with the connecting port 1011, the communication between the mouse 1 and the computer system 100 is established.

Recently, electronic sports games became popular. Consequently, the requirements of frequently changing the sensitivity of the mouse are increased. Generally, the sensitivity of a mouse is expressed as dots per linear inch (DPI). For complying the requirements, a switching module is installed in the casing of the mouse. FIG. 2 is a schematic cross-sectional view illustrating a portion of the conventional sensitivity-adjustable mouse. As shown in FIGS. 1 and 2, the mouse 1 further comprises an illumination module 15 and a switching button 16.

The illumination module 15 comprises a circuit board 151, plural light emitting diodes 152, plural light-guiding posts 153 and a display panel 154. The circuit board 151 is disposed within the casing 10. The plural light emitting diodes 152 are installed on a top surface of the circuit board 151. The plural light emitting diodes 152 can emit plural light beams (not shown). The plural light-guiding posts 153 are aligned with the plural light emitting diodes 152, respectively. Moreover, the plural light-guiding posts 153 are arranged between the casing 10 and the corresponding light emitting diodes 152. The light beams are guided to the display panel 154 by the light-guiding posts 153. The display panel 154 is placed over the casing 10 to cover the casing 10, and the display panel 154 is exposed outside the casing 10. The display panel 154 comprises plural projection regions 1541 corresponding to the plural light emitting diodes 152.

The casing 10 further comprises plural baffles 17. The plural baffles 17 are inserted into the spaces between the light emitting diodes 152 for blocking the light beams. Consequently, the light beams are only permitted to pass through the corresponding light-guiding posts 153.

The switching button 16 comprises a button body 161 and a triggering switch 162. The button body 161 is installed on the casing 10 and partially exposed outside the casing 10. Consequently, the button body 161 can be pressed down by the user. The triggering switch 162 is installed on the circuit board 151 and located under the button body 161. When the button body 161 is pressed down by the user, the button body 161 is moved downwardly relative to the casing 10 to push the triggering switch 162. Consequently, the triggering switch 162 generates a switching signal. In response to the switching signal, the sensitivity of the mouse 1 is changed.

In FIG. 2, four projection regions 154 are shown. When the illumination module 15 is enabled, the corresponding projection regions 154 are illuminated. For example, when the mouse 1 has the default sensitivity (e.g., a first sensitivity), no projection regions 154 are illuminated. When the switching button 16 is pressed down and the triggering switch 162 is triggered, the mouse has a second sensitivity and one of the projection regions 154 is illuminated by the illumination module 15. When the switching button 16 is pressed down again and the triggering switch 162 is triggered again, the mouse has a third sensitivity and two of the projection regions 154 are illuminated by the illumination module 15. When the switching button 16 is pressed down again and the triggering switch 162 is triggered again, the mouse has a fourth sensitivity and three of the projection regions 154 are illuminated by the illumination module 15. When the switching button 16 is pressed down again and the triggering switch 162 is triggered again, the mouse has a fifth sensitivity and the four projection regions 154 are illuminated by the illumination module 15.

However, since the illumination module 15 and the switching button 16 are separately installed on the casing of the mouse 1, the appearance of the mouse 1 is not aesthetically pleasing. Moreover, since the number of components in the mouse 1 is large, the fabricating cost of the mouse 1 is high.

Therefore, there is a need of providing a sensitivity-adjustable mouse with aesthetically pleasing appearance.

SUMMARY OF THE INVENTION

An object of the present invention provides a sensitivity-adjustable mouse with aesthetically pleasing appearance.

Another object of the present invention provides a sensitivity-adjustable mouse with small number of components.

In accordance with an aspect of the present invention, a sensitivity-adjustable mouse is provided. The sensitivity-adjustable mouse includes a casing, a switching button, an illumination module and a lightshade cover. The switching button is installed on the casing and partially exposed outside the casing. The switching button is swingable relative to the casing. The illumination module is disposed within the casing and located under the switching button.

The illumination module emits plural light beams to the switching button. The lightshade cover is connected with the switching button and arranged between the switching button and the illumination module. The plural light beams are divided by the lightshade cover. Consequently, the light beams are projected to corresponding positions of the switching button.

In an embodiment, the casing includes a rotation shaft, and the switching button is sheathed around the rotation shaft. The switching button is rotatable about the rotation shaft and swingable relative to the casing. The switching button includes a button body, ring-shaped connection part and plural first coupling structures. The button body includes plural projection regions. The ring-shaped connection part is located at an end of the button body and sheathed around the rotation shaft. The plural first coupling structures is installed on a bottom surface of the button body and coupled with the lightshade cover.

In an embodiment, the lightshade cover includes a cover body, plural baffles, plural second coupling parts and plural third coupling parts. The cover body includes plural openings. The plural openings are aligned with the corresponding projection regions. The plural baffles are protruded from a bottom surface of the cover body. The plural light beams are divided by the plural baffles. The plural second coupling parts are aligned with the corresponding first coupling structures. The plural second coupling parts are coupled with the corresponding first coupling structures, so that the lightshade cover and the casing are combined with each other. The plural third coupling parts are disposed on the bottom surface of the cover body and coupled with the illumination module.

From the above descriptions, the present invention provides the sensitivity-adjustable mouse. The structures of the switching button, the illumination module and the lightshade cover are specially designed. The illumination module and the lightshade cover are covered by the switching button. Consequently, the switching button, the illumination module and the lightshade cover are combined together to have the appearance of a single button structure. Consequently, the mouse of the present invention has the aesthetically pleasing appearance when compared with the conventional technology. Moreover, since the functions of many components of the conventional technology are implemented through the switching button, the illumination module and the lightshade cover, the mouse of the present invention has a smaller number of components. In other words, the mouse of the present invention is cost-effective.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
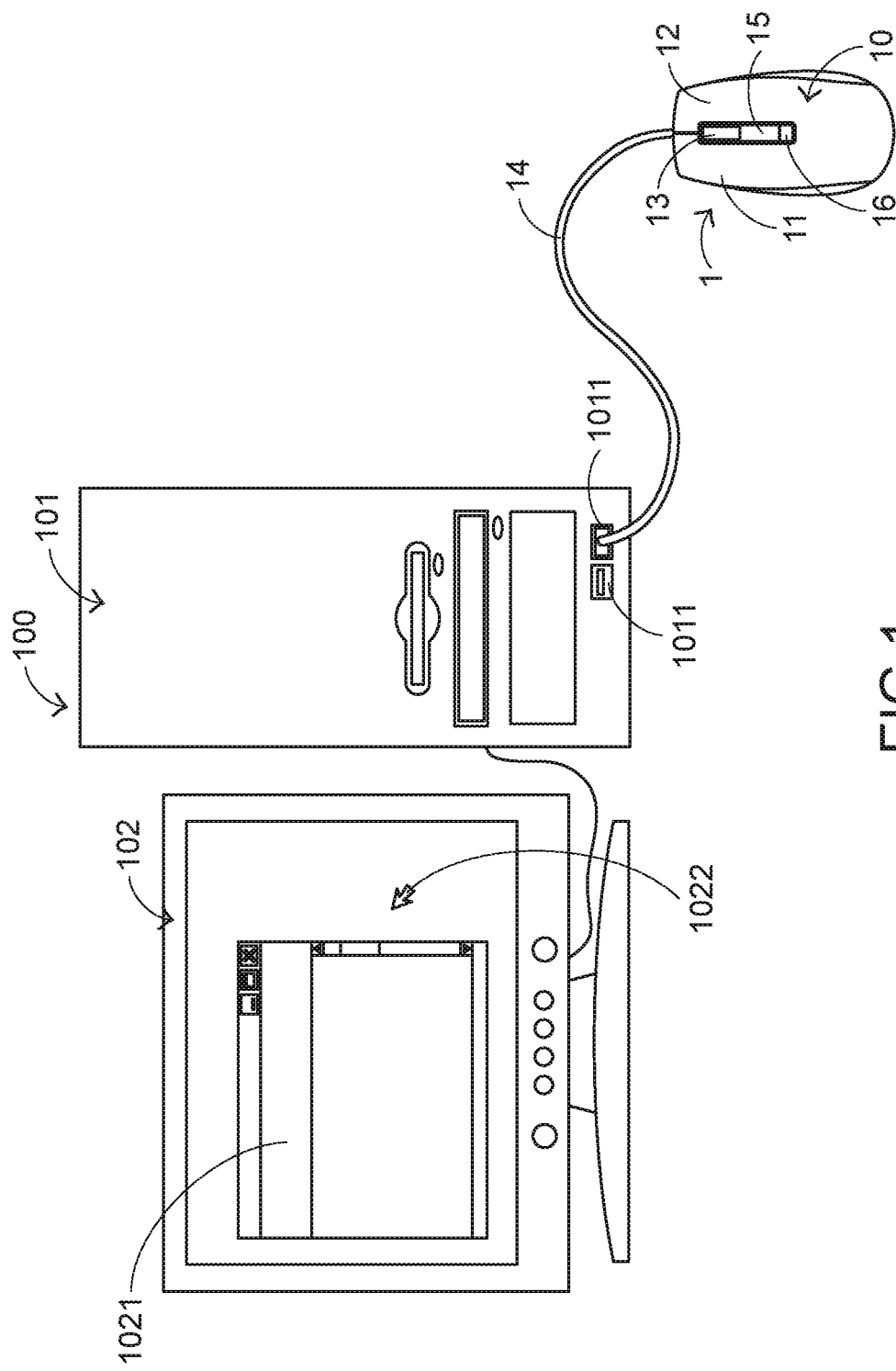
FIG. 1 is a schematic diagram illustrating the connection between a conventional sensitivity-adjustable mouse and a computer system.
Figure 2:
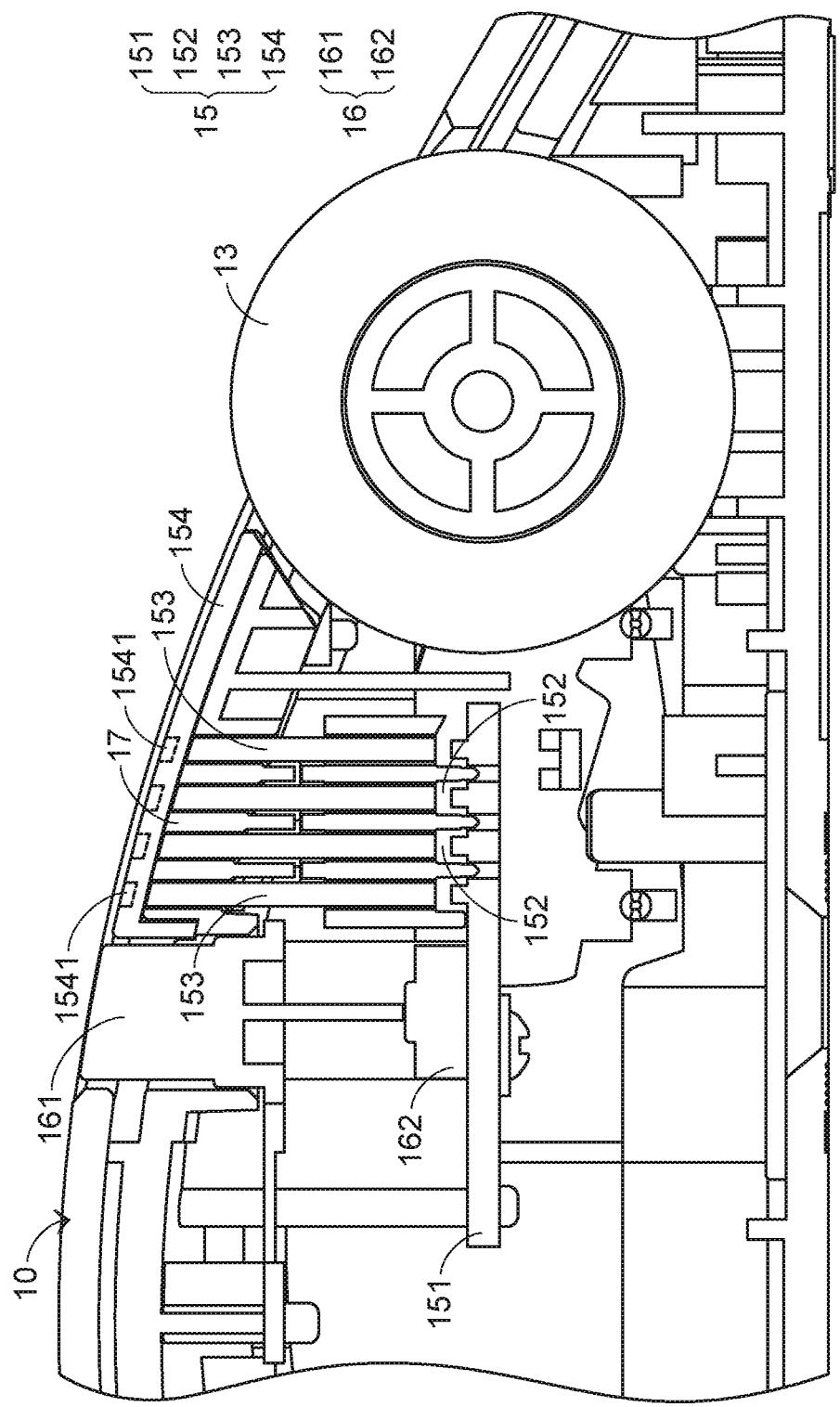
FIG. 2 is a schematic cross-sectional view illustrating a portion of the conventional sensitivity-adjustable mouse.

The present invention provides a sensitivity-adjustable mouse in order to overcome the drawbacks of the conventional technologies. The embodiments of present invention will be described more specifically with reference to the following drawings. For well understanding the present invention, the elements shown in the drawings are not in scale with the elements of the practical product. In the following embodiments and drawings, the elements irrelevant to the concepts of the present invention or the elements well known to those skilled in the art are omitted. It is noted that numerous modifications and alterations may be made while retaining the teachings of the invention.

Figure 3:
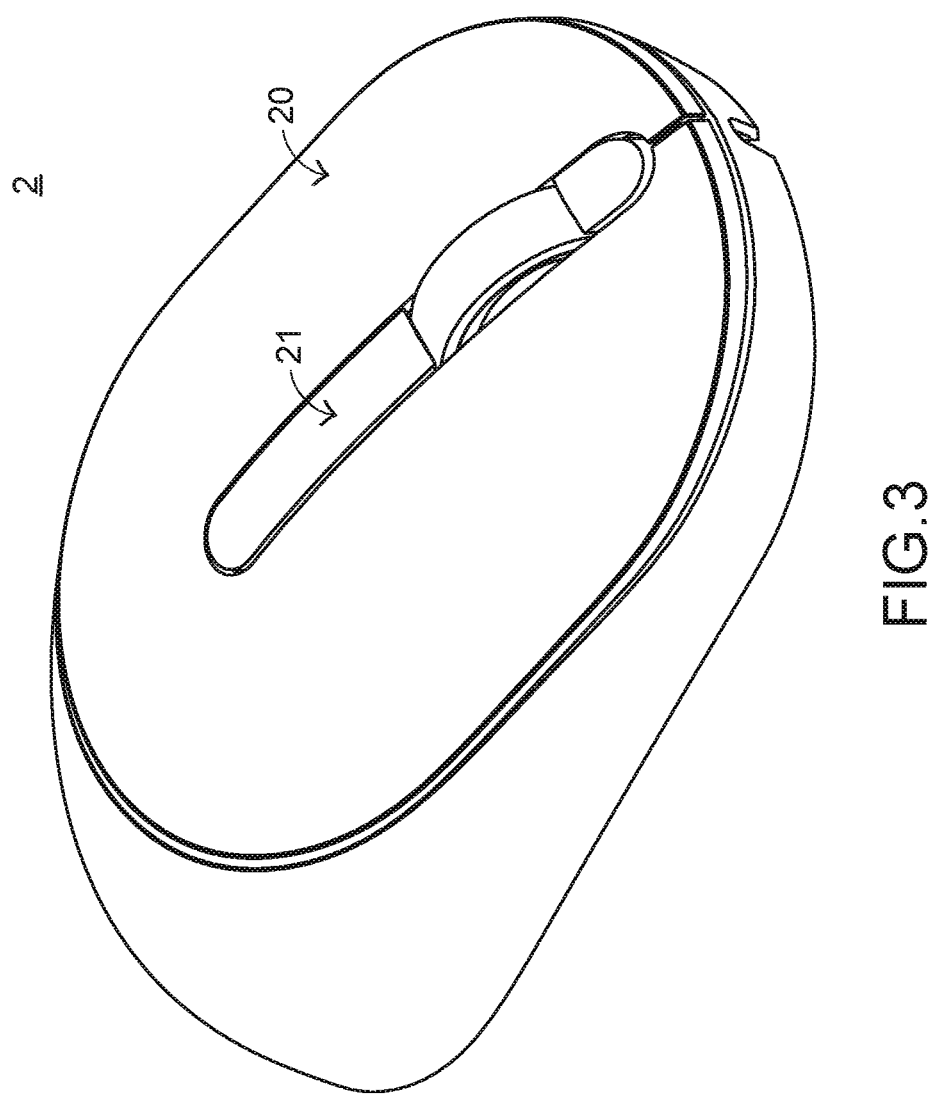
FIG. 3 is a schematic perspective view illustrating the appearance of a sensitivity-adjustable mouse according to an embodiment of the present invention.
Figure 4:
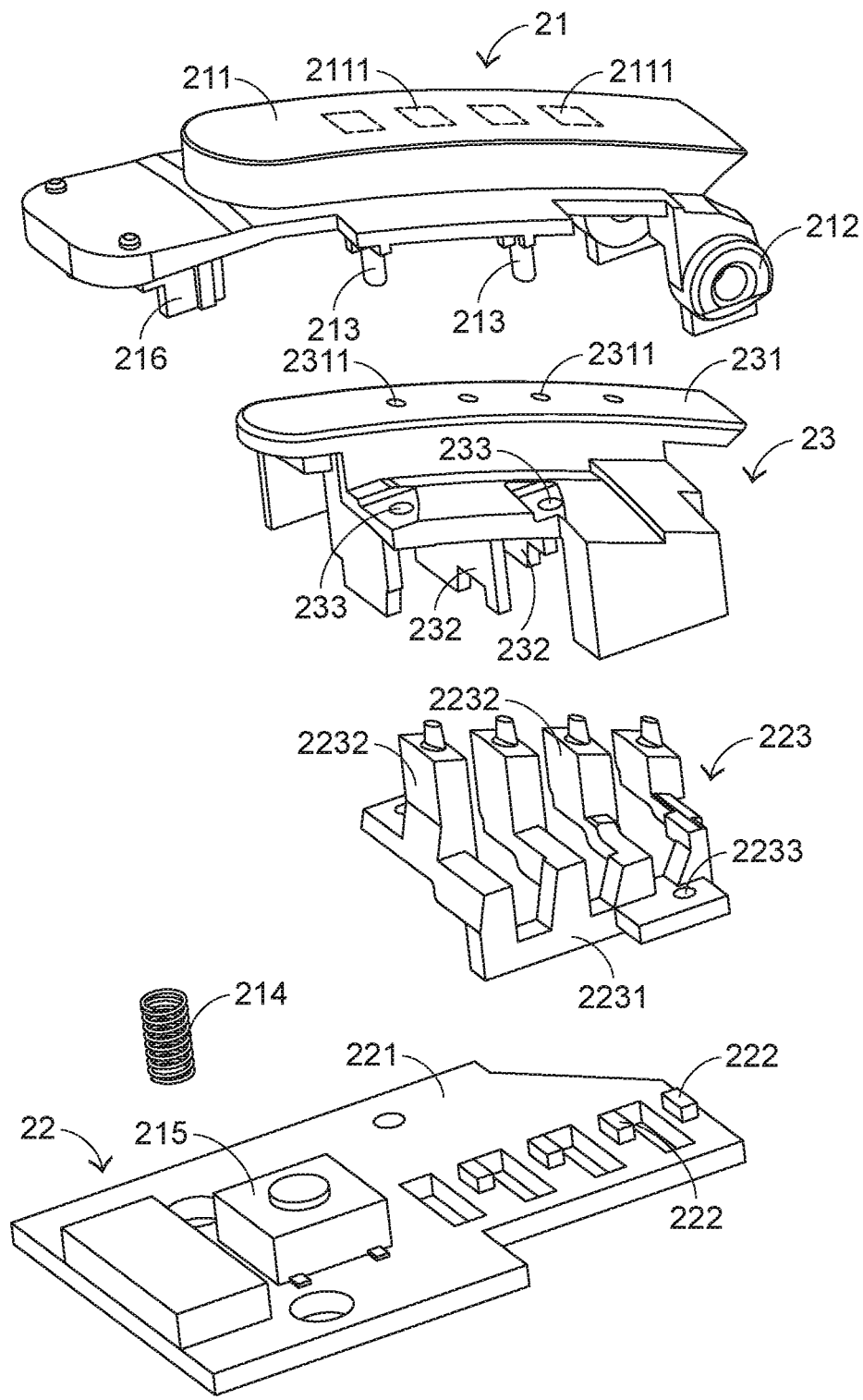
FIG. 4 is a schematic exploded view illustrating a portion of the sensitivity-adjustable mouse according to the embodiment of the present invention.

Hereinafter, the structure of the sensitivity-adjustable mouse of the present invention will be illustrated with reference to FIGS. 3 and 4. FIG. 3 is a schematic perspective view illustrating the appearance of a sensitivity-adjustable mouse according to an embodiment of the present invention. FIG. 4 is a schematic exploded view illustrating a portion of the sensitivity-adjustable mouse according to the embodiment of the present invention. In an embodiment, the sensitivity-adjustable mouse 2 comprises a casing 20, a switching button 21, an illumination module 22 and a lightshade cover 23. The casing 20 comprises a rotation shaft 201 (see FIG. 6). The switching button 21 is installed on the casing 20 and partially exposed outside the casing 20. When the switching button 21 is pressed down by the user, the switching button 21 is swung relative to the casing 20. The illumination module 22 is disposed within the casing 20 and located under the switching button 21. The illumination module 22 emits plural light beams (not shown) and projects the plural light beams to the switching button 21. The lightshade cover 23 is connected with the switching button 21 and arranged between the switching button 21 and the illumination module 22. The plural light beams are divided by the lightshade cover 23. Consequently, each light beam is projected to the corresponding position of the switching button 21.

The detailed structures of the above components will be described as follows.

Please refer to FIGS. 3 and 4 again. The switching button 21 is sheathed around the rotation shaft 201 of the casing 20. Moreover, the switching button 21 is rotatable about the rotation shaft 201 and swingable relative to the casing 20. In an embodiment, the switching button 21 comprises a button body 211, a ring-shaped connection part 212, plural first coupling structures 213, an elastic element 214, a triggering switch 215 and a driving part 216. The button body 211 comprises plural projection regions 2111. The ring-shaped connection part 212 is located at an end of the button body 211 and sheathed around the rotation shaft 201 of the casing 20. The plural first coupling structures 213 are installed on a bottom surface of the button body 211 and coupled with the lightshade cover 23. The structures of the elastic element 214, the triggering switch 215 and the driving part 216 and the relationships between these components will be described later. Preferably but not exclusively, the ring-shaped connection part 212, the plural first coupling structures 213 and the driving part 216 are integrally formed with the button body 211, and the plural first coupling structures 213 are protrusion posts.

Figure 5:
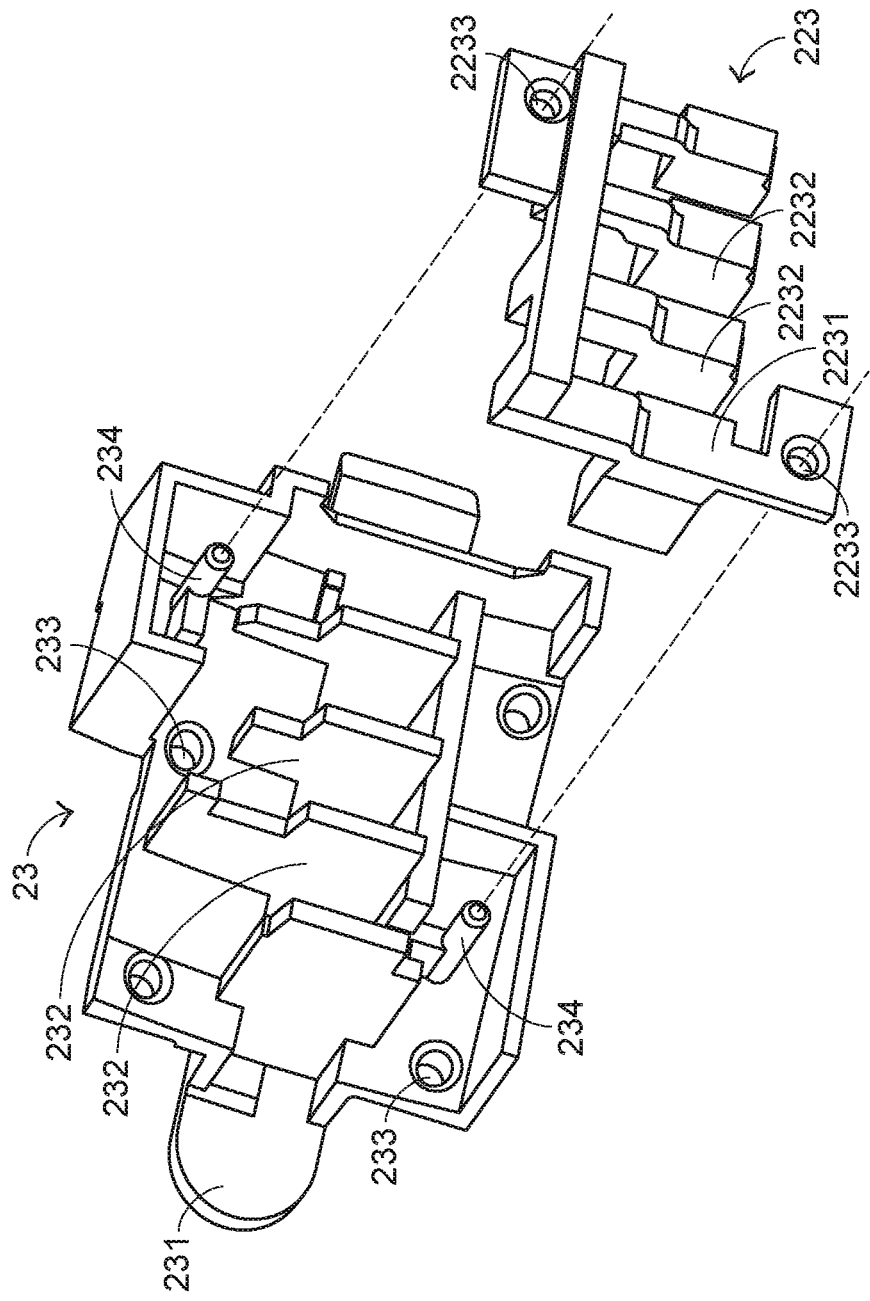
FIG. 5 is a schematic exploded view illustrating a portion of the sensitivity-adjustable mouse according to the embodiment of the present invention and taken along another viewpoint.

FIG. 5 is a schematic exploded view illustrating a portion of the sensitivity-adjustable mouse according to the embodiment of the present invention and taken along another viewpoint. As shown in FIGS. 4 and 5, the lightshade cover 23 comprises a cover body 231, plural baffles 232, plural second coupling parts 233 and plural third coupling parts 234. The cover body 231 comprises plural openings 2311. The plural openings 2311 are aligned with the plural projection regions 2111, respectively. The plural baffles 232 are protruded downwardly from a bottom surface of the cover body 231. The plural baffles 232 are inserted into the illumination module 22 to divide the light beams. The plural second coupling parts 233 are aligned with the plural first coupling structures 213, respectively. Moreover, the plural second coupling parts 233 are coupled with the corresponding first coupling structures 213, and thus the lightshade cover 23 is combined with the casing 20. The plural third coupling parts 234 are disposed on the bottom surface of the cover body 231 and coupled with the illumination module 22. Preferably but not exclusively, the plural baffles 232 and the plural third coupling parts 234 are integrally formed with the cover body 231, the plural second coupling parts 233 are coupling holes, and the plural third coupling parts 234 are protrusion posts.

In an embodiment, the plural first coupling structures 213 are penetrated through the corresponding second coupling parts 233, and the plural first coupling structures 213 and the corresponding second coupling parts 233 are fixed on each other through a hot melting process. While the hot melting process is performed, the portions of the first coupling structures 213 that are penetrated through the corresponding second coupling parts 233 are subjected to thermal treatment and molten. After the molten portion are cooled down, the first coupling structures 213 and the corresponding second coupling parts 233 are coupled with and fixed on each other.

The detailed structures of the illumination module 22 will be described as follows. Please refer to FIGS. 4 and 5 again. In an embodiment, the illumination module 22 comprises a circuit board 221, plural light-emitting elements 222 and a light-guiding assembly 223. The circuit board 221 is connected with the casing 20 and located under the switching button 21 and the lightshade cover 23. The plural light-emitting elements 222 are installed on the circuit board 221 to emit plural light beams. Moreover, each light-emitting element 222 is aligned with one corresponding opening 2311 and one corresponding projection region 2111. The light-guiding assembly 223 is connected with the lightshade cover 23 and arranged between the lightshade cover 23 and the plural light-emitting elements 222. The light beams are guided to corresponding positions of the switching button 21 (i.e., the projection regions 2111) by the light-guiding assembly 223. In an embodiment, the light-emitting elements 222 are light emitting diodes, and the circuit board 221 is a printed circuit board (PCB). The examples of the light-emitting elements and the circuit board are presented herein for purpose of illustration and description only.

In an embodiment, the light-guiding assembly 223 comprises a light-guiding body 2231, plural light-guiding posts 2232 and plural fourth coupling parts 2233. The plural light-guiding posts 2232 are protruded upwardly from the light-guiding body 2231. Each light-guiding post 2232 is aligned with one corresponding light-emitting element 222. The light-guiding posts 2232 are used for guiding the light beams. After the light beams pass through the openings 2311, the light beams are guided by the light-guiding posts 2232 and projected to the corresponding projection regions 2111. The plural light-guiding posts 2232 are sheltered by the baffles 232. Due to the light-guiding posts 2232, the light beams from the light-emitting elements 222 are only permitted be transferred through the corresponding light-guiding posts 2232 and the corresponding openings 2311 and projected to the corresponding projection regions 2111. Consequently, the projection regions 2111 are illuminated.

The plural fourth coupling parts 2233 are disposed on the light-guiding body 2231 and aligned with the corresponding third coupling parts 234. Moreover, the fourth coupling parts 2233 are coupled with the third coupling parts 234, and thus the light-guiding assembly 223 and the lightshade cover 23 are combined together. Preferably but not exclusively, the plural fourth coupling parts 2233 are integrally formed with the light-guiding body 2231, and the plural fourth coupling parts 2233 are coupling holes. In an embodiment, the plural third coupling parts 234 are penetrated through the corresponding fourth coupling parts 2233, and the plural third coupling parts 234 and the corresponding fourth coupling parts 2233 are fixed on each other through a hot melting process.

Figure 6:
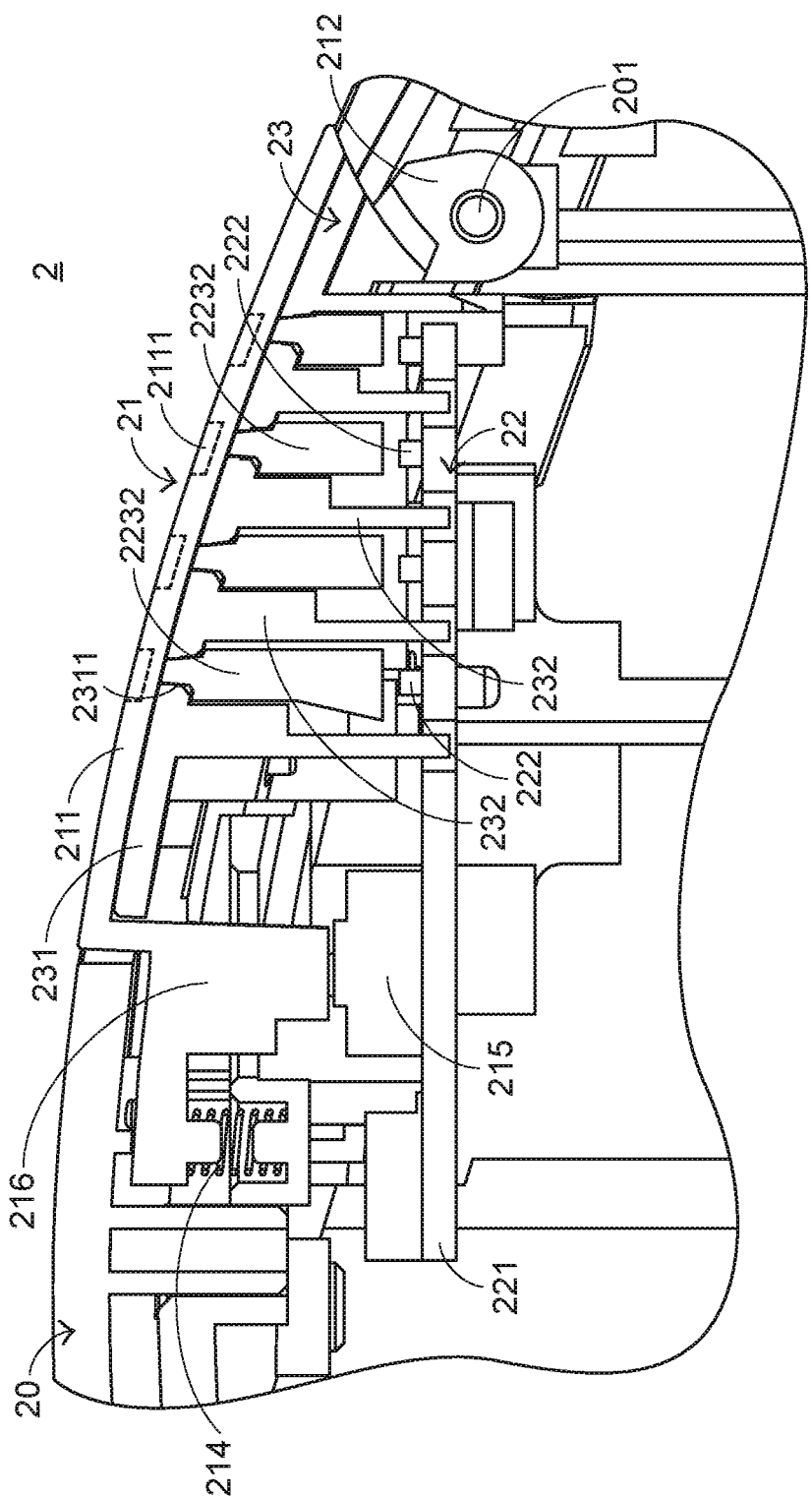
FIG. 6 is a schematic cross-sectional view illustrating a portion of the sensitivity-adjustable mouse according to the embodiment of the present invention.

The relationships between the elastic element 214, the triggering switch 215 and the driving part 216 will be described as follows. FIG. 6 is a schematic cross-sectional view illustrating a portion of the sensitivity-adjustable mouse according to the embodiment of the present invention. Please refer to FIGS. 4, 5 and 6. The elastic element 214 is disposed on the casing 20 and contacted with the button body 211. The triggering switch 215 is installed on the circuit board 221. When the triggering switch 215 is pressed down, the triggering switch 215 generates a switching signal. The triggering switch 215 and the light-emitting elements 222 are installed on a top surface of the circuit board 221. That is, the triggering switch 215 and the light-emitting elements 222 are located at the same side of the circuit board 221. The driving part 216 is installed on the bottom surface of the button body 211 and located near the triggering switch 215. In an embodiment, the elastic element 214 is a helical spring. It is noted that the example of the elastic element is not restricted. For example, in another embodiment, the elastic element is a resilience sheet.

While the switching button 21 is pressed down, the button body 211 is rotated about the rotation shaft 201 and swung relative to the casing 20, and the driving part 216 is moved downwardly to push the triggering switch 215. At the same time, the elastic element 214 is compressed, and the triggering switch 215 generates the switching signal. According to the switching signal, the sensitivity of the mouse 2 is changed. When the switching button 21 is no longer pressed by the user, the button body 211 is rotated about the rotation shaft 201 and swung relative to the casing 20 along a reverse direction. In response to the elastic force of the compressed elastic element 214, the elastic element 214 is restored to its original shape and the button body 211 is returned to its original position.

In FIG. 6 four projection regions 2111 are shown. When the illumination module 22 is enabled, the corresponding projection regions 2111 are illuminated. Moreover, the operation of the switching button 21 can switch the sensitivity of the mouse 1. For example, when the mouse 2 has the default sensitivity (e.g., a first sensitivity), no projection regions 2111 are illuminated. When the switching button 21 is pressed down and the triggering switch 215 is triggered to generate the switching signal, the mouse has a second sensitivity and one of the projection regions 2111 is illuminated by the illumination module 22. When the switching button 21 is pressed down again and the triggering switch 215 is triggered to generate the switching signal again, the mouse 2 has a third sensitivity and two of the projection regions 2111 are illuminated by the illumination module 22. When the switching button 21 is pressed down again and the triggering switch 215 is triggered to generate the switching signal again, the mouse has a fourth sensitivity and three of the projection regions 2111 are illuminated by the illumination module 22. When the switching button 21 is pressed down again and the triggering switch 215 is triggered to generate the switching signal again, the mouse has a fifth sensitivity and the four projection regions 2111 are illuminated by the illumination module 22. The usage example is presented herein for purpose of illustration and description only.

It is noted that numerous modifications and alterations may be made while retaining the teachings of the invention. A variant usage example of the sensitivity-adjustable mouse will be described as follows. For example, when the mouse has the default sensitivity (e.g., a first sensitivity), no projection regions are illuminated. When the switching button is pressed down and the triggering switch is triggered to generate the switching signal, the mouse has a second sensitivity and a first one of the projection regions is illuminated by the illumination module. When the switching button is pressed down again and the triggering switch is triggered to generate the switching signal again, the mouse has a third sensitivity and a second one of the projection regions is illuminated by the illumination module. When the switching button is pressed down again and the triggering switch is triggered to generate the switching signal again, the mouse has a fourth sensitivity and a third one of the projection regions is illuminated by the illumination module. When the switching button is pressed down again and the triggering switch is triggered to generate the switching signal again, the mouse has a fifth sensitivity and a fourth one of the projection regions is illuminated by the illumination module. In other words, only one projection region is illuminated at a time, and the sensitivity of the mouse can be realized according to the illuminated projection region.

From the above descriptions, the present invention provides the sensitivity-adjustable mouse. The structures of the switching button, the illumination module and the lightshade cover are specially designed. The illumination module and the lightshade cover are covered by the switching button. Consequently, the switching button, the illumination module and the lightshade cover are combined together to have the appearance of a single button structure. Consequently, the mouse of the present invention has the aesthetically pleasing appearance when compared with the conventional technology. Moreover, since the functions of many components of the conventional technology are implemented through the switching button, the illumination module and the lightshade cover, the mouse of the present invention has a smaller number of components. In other words, the mouse of the present invention is cost-effective.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A sensitivity-adjustable mouse, comprising:
a casing, wherein the casing comprises a rotation shaft;
a switching button installed on the casing and partially exposed outside the casing, wherein the switching button is swingable relative to the casing, wherein the switching button is sheathed around the rotation shaft, wherein the switching button is rotatable about the rotation shaft and swingable relative to the casing, and the switching button comprises:
a button body comprising plural projection regions;
a ring-shaped connection part located at an end of the button body and sheathed around the rotation shaft; and
plural first coupling structures installed on a bottom surface of the button body;
an illumination module disposed within the casing and located under the switching button, wherein the illumination module emits plural light beams to the switching button; and
a lightshade cover connected with the switching button and arranged between the switching button and the illumination module, wherein the plural light beams are divided by the lightshade cover, so that the light beams are projected to corresponding positions of the switching button, wherein the lightshade cover comprises:
a cover body comprising plural openings, wherein the plural openings are aligned with the corresponding projection regions;
plural baffles protruded from a bottom surface of the cover body, wherein the plural light beams are divided by the plural baffles;
plural second coupling parts aligned with the corresponding first coupling structures, wherein the plural first coupling structures are coupled with the lightshade cover and the plural second coupling parts are coupled with the corresponding first coupling structures, so that the lightshade cover and the casing are combined with each other; and
plural third coupling parts disposed on the bottom surface of the cover body and coupled with the illumination module.

2. The sensitivity-adjustable mouse according to claim 1, wherein after the plural first coupling structures are penetrated through the corresponding second coupling parts, the plural first coupling structures and the corresponding second coupling parts are fixed on each other through a hot melting process, wherein the first coupling structures are protrusion posts, and the second coupling parts are coupling holes.

3. The sensitivity-adjustable mouse according to claim 1, wherein the illumination module comprises:
a circuit board connected with the casing and located under the switching button and the lightshade cover;
plural light-emitting elements installed on the circuit board, and emitting plural light beams; and
a light-guiding assembly connected with the lightshade cover and arranged between the lightshade cover and the plural light-emitting elements, wherein the light beams are guided to the corresponding positions of the switching button by the light-guiding assembly.

4. The sensitivity-adjustable mouse according to claim 3, wherein the light-guiding assembly comprises:
a light-guiding body;
plural light-guiding posts protruded upwardly from the light-guiding body, and aligned with the corresponding light-emitting elements, wherein the light beams are guided by the plural light-guiding posts, so that the light beams are transferred through the corresponding openings and projected to the corresponding projection regions, wherein the plural light-guiding posts are sheltered by the baffles, so that the light beams from the plural light-emitting elements are transferred through the corresponding light-guiding posts and the corresponding openings and projected to the corresponding projection regions; and plural fourth coupling parts disposed on the light-guiding body and aligned with the corresponding third coupling parts, wherein the fourth coupling parts are coupled with the third coupling parts, so that the light-guiding assembly and the lightshade cover are combined together.

5. The sensitivity-adjustable mouse according to claim 4, wherein after the plural third coupling parts are penetrated through the corresponding fourth coupling parts, the plural third coupling parts and the corresponding fourth coupling parts are fixed on each other through a hot melting process, wherein the third coupling structures are protrusion posts, and the fourth coupling parts are coupling holes.

6. The sensitivity-adjustable mouse according to claim 3, wherein the switching button further comprises:

an elastic element disposed on the casing and contacted with the button body;

a triggering switch installed on the circuit board, wherein when the triggering switch is pressed down, a switching signal is generated; and a driving part installed on the bottom surface of the button body and located near the triggering switch.

7. The sensitivity-adjustable mouse according to claim 6, wherein while the switching button is pressed down, the button body is rotated about the rotation shaft and swung relative to the casing, and the driving part is moved downwardly to push the triggering switch, so that the elastic element is compressed and the triggering switch generates the switching signal, wherein when the switching button is not pressed by the user, the button body is rotated about the rotation shaft and swung relative to the casing, and the elastic element is restored to an original shape and the button body is returned to an original position in response to an elastic force of the compressed elastic element.

8. The sensitivity-adjustable mouse according to claim 6, wherein the triggering switch and the plural light-emitting elements are located at a same side of the circuit board.

\* \* \* \* \*